US012672241B2

(12) United States Patent (10) Patent No.: US 12,672,241 B2

Takahashi et al. (45) Date of Patent: Jun. 30, 2026

(54) FLEXIBLE PRINTED CIRCUIT BOARD, WIRING MODULE, FLEXIBLE PRINTED CIRCUIT BOARD INCLUDING TERMINAL, AND POWER STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

(72) Inventors: Hideo Takahashi, Mie (JP); Shinichi Takase, Mie (JP); Hiroki Shimoda, Mie (JP); Tsutomu Kitajima, Shiga (JP); Yoshiro Adachi, Shiga (JP); Yuuki Oohashi, Shiga (JP); Manabu Sudou, Shiga (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 177 days.

(21) Appl. No.: 18/812,563

(22) Filed: Aug. 22, 2024

(65) Prior Publication Data

US 2024/0414848 A1 Dec. 12, 2024

Related U.S. Application Data

(63) Continuation of application No. 17/770,384, filed as application No. PCT/JP2020/033709 on Sep. 7, 2020, now Pat. No. 12,101,888.

(30) Foreign Application Priority Data

Oct. 31, 2019 (JP) ................................. 2019-198338

(51) Int. Cl.
*H05K 1/18* (2026.01)
*H05K 1/11* (2006.01)
*H05K 1/189* (2026.01)

(52) U.S. Cl.
CPC ............... *H05K 1/189* (2013.01); *H05K 1/11* (2013.01); *H05K 2201/09281* (2013.01); *H05K 2201/09427* (2013.01); *H05K 2201/10916* (2013.01)

(58) Field of Classification Search
CPC .................... H05K 1/189; H05K 1/11; H05K 2201/09281; H05K 2201/09427; H05K 2201/10916

(Continued)

(56) References Cited

U.S. PATENT DOCUMENTS 5,712,610 A 1/1998 Takeichi
10,601,017 B2 * 3/2020 Ota ..................... H01M 50/502
(Continued)

FOREIGN PATENT DOCUMENTS

JP 06-244541 9/1994
JP 2010-267903 11/2010
(Continued)

OTHER PUBLICATIONS

International Search Report issued in International Patent Application No. PCT/JP2020/033709, dated Nov. 24, 2020, along with an English translation thereof.

*Primary Examiner* — Binh B Tran
(74) *Attorney, Agent, or Firm* — Greenblum & Bernstein, P.L.C.

(57) ABSTRACT

A flexible printed circuit board includes an electrically conductive line, and a land connected to the electrically
(Continued)

conductive line and to be connected to a terminal, the land including soldering portions that have metal surfaces and to which the terminal is to be soldered. The terminal includes an overlapping section that overlaps the flexible printed circuit board and a protruding section that protrudes outward from the flexible printed circuit board and is soldered to a connecting member that connects electrode portions of power storage elements.

5 Claims, 13 Drawing Sheets

(58) Field of Classification Search
USPC .......................................................... 361/749
See application file for complete search history.

(56) References Cited

U.S. PATENT DOCUMENTS

| | | | |
|---|---|---|---|
| 10,644,292 B2 * | 5/2020 | Takase ................. | H01M 50/581 |
| 2010/0046939 A1 | 2/2010 | Masuzawa | |
| 2012/0019061 A1 | 1/2012 | Nishihara et al. | |
| 2020/0044223 A1 | 2/2020 | Takase et al. | |

FOREIGN PATENT DOCUMENTS

| | | |
|---|---|---|
| JP | 2013-131528 | 7/2013 |
| JP | 2018-60612 | 4/2018 |
| WO | 2010/113455 | 10/2010 |

* cited by examiner

FLEXIBLE PRINTED CIRCUIT BOARD, WIRING MODULE, FLEXIBLE PRINTED CIRCUIT BOARD INCLUDING TERMINAL, AND POWER STORAGE MODULE

CROSS-REFERENCE TO RELATED APPLICATIONS

This application is a Continuation of U.S. patent application Ser. No. 17/770,384, filed Apr. 20 2022, which is a US National Stage Entry of International Patent Application No. PCT/JP2020/033709, filed Sep. 7, 2020, which claims the benefit of Japanese Patent Application No. 2019-198338, filed Oct. 31, 2019. The contents of these applications are incorporated herein by reference in their entirety.

TECHNICAL FIELD

The technology disclosed herein relates to a flexible printed circuit board, a wiring module, a flexible printed circuit board including a terminal, and a power storage module.

BACKGROUND ART

A battery module disclosed in WO/2010-113455 (Patent Document 1) has been known. In the battery module, the coupling bus bar that is connected to the terminals of the adjacent battery cells includes a linking portion having a tongue shape. The linking portion is disposed on the contact pad on the flexible printed circuit board and the linking portion and the contact pad are connected with reflow soldering.

PRIOR ART DOCUMENT

Patent Document

Patent Document 1: WO 2010-113455

SUMMARY OF THE INVENTION

Problem to be Solved by the Invention

In the configuration in which the linking portion of the tongue shape is connected to the contact pad with reflow soldering, the linking portion, which is disposed on the contact pad, may be moved during the reflow soldering and this may cause problems by position displacement of the linking portion.

The technology described herein was made in view of the above circumstances. An object is to provide a flexible printed circuit board, a flexible printed circuit board including a terminal, and a power storage module that are less likely to cause problems by position displacement of the terminal.

Means for Solving the Problem

A flexible printed circuit board described herein includes an electrically conductive line and a land connected to the electrically conductive line and to be connected to a terminal. The land includes soldering portions that have metal surfaces and to which the terminal is to be soldered. A dividing section is between the soldering portions. The dividing section has a non-metal surface and defines each of the soldering portions that are adjacent to each other.

Effects of the Invention

According to the technology described herein, problems are less likely to be caused by position displacement of a terminal that is to be soldered to a flexible printed circuit board.

MODES FOR CARRYING OUT THE PRESENT DISCLOSURE

Figure 1:
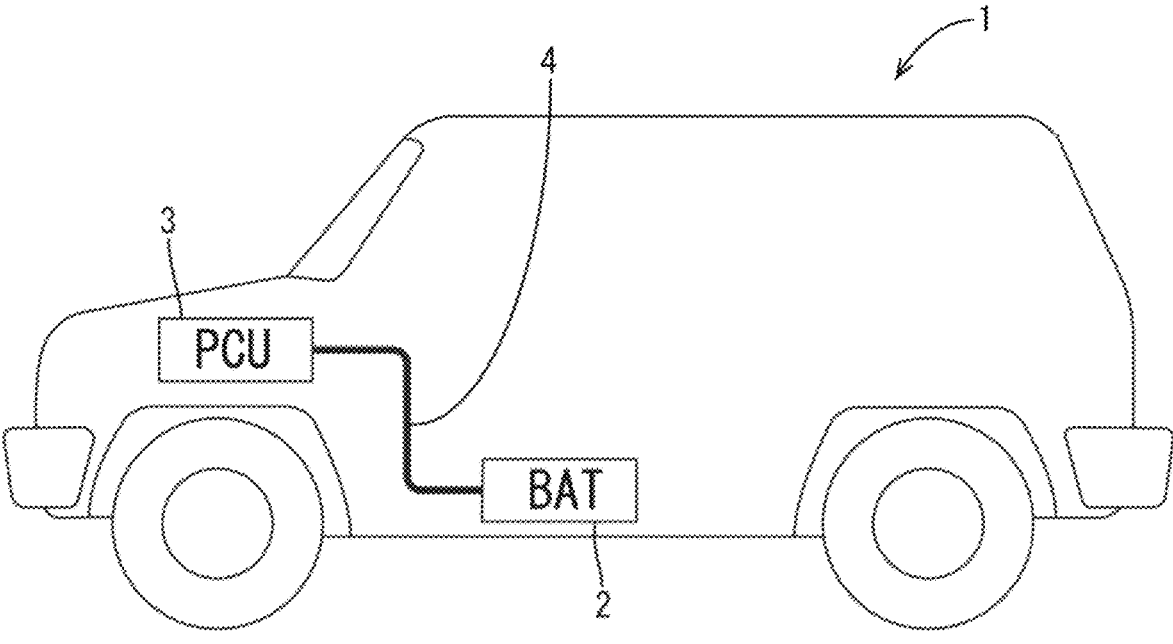
FIG. 1 is a schematic view illustrating a vehicle on which a power storage module according to one embodiment is installed.

Description of Embodiments According to the Present Disclosure

First, embodiments according to the present disclosure will be listed and described.

(1) A flexible printed circuit board described herein includes an electrically conductive line and a land connected to the electrically conductive line and to be connected to a terminal. The land includes soldering portions that have metal surfaces and to which the terminal is to be soldered. A dividing section is between the soldering portions. The dividing section has a non-metal surface and defines each of the soldering portions that are adjacent to each other.

According to this configuration, even if the solder on the soldering portions is melted during the reflow soldering, the dividing section having the non-metal surface that is between the adjacent soldering portions suppresses the solder from moving. Therefore, the terminal is less likely to move from an original position when the solder is melted. Therefore, problems are less likely to be caused by position displacement of the terminal.

(2) The flexible printed circuit board may extend to have a belt shape and the soldering portions may be arranged in an extending direction in which the flexible printed circuit board extends.

According to such a configuration, the position displacement of the terminal with respect to the extending direction in which the flexible printed circuit board extends is suppressed.

(3) The flexible printed circuit board may extend to have a belt shape and the soldering portions may be arranged in a direction crossing an extending direction in which the flexible printed circuit board extends.

According to such a configuration, the position displacement of the terminal with respect to the direction crossing the extending direction in which the flexible printed circuit board extends is suppressed.

(4) The soldering portions may include at least three soldering portions that are arranged in an arrangement direction. Two soldering portions out of the at least three soldering portions that are at two ends with respect to the arrangement direction may have a dimension measured in the arrangement direction greater than other soldering portion out of the at least three soldering portions that is on inner side with respect to the two ends.

According to such a configuration, the position displacement of the terminal with respect to the arrangement direction in which the at least three soldering portions are arranged is suppressed.

(5) The dividing section may include a first dividing section and a second dividing section that extend in different directions. The first dividing section and the second dividing section may cross each other.

(6) The vehicular flexible printed circuit board may be preferably to be installed in a vehicle.

(7) A wiring module according to the present disclosure includes the flexible printed circuit board, the terminal to be soldered to the land on the flexible printed circuit board, and an insulating protector holding the flexible printed circuit board.

(8) The wiring module may be preferably to be installed in a vehicle.

(9) A flexible printed circuit board including a terminal according to the present disclosure includes the flexible printed circuit board and the terminal to be soldered to the land on the flexible printed circuit board.

(10) The land may be entirely disposed within an area that overlaps the terminal.

According to such a configuration, the area in which the solder on the land moves is smaller compared to a configuration in which a portion of the land is outside the terminal. Therefore, position displacement of the terminal is less likely to occur when the solder is melted.

(11) The flexible printed circuit board including the terminal may be preferably to be installed in a vehicle.

(12) The soldering portions may include sections that overlap the terminal and sections that do not overlap the terminal.

With such a configuration, because the solder fillet of the solder at an edge surface (a side surface) of the terminal is likely to be exposed, an appearance test of the solder fillet of the solder can be performed easily. With the solder fillet of the solder provided at the edge surface (the side surface) of the terminal, bonding strength between the soldering portions and the terminal can be increased.

(13) A power storage module according to the present disclosure includes the flexible printed circuit board including the terminal, power storage elements including electrode portions that include positive electrode portions and negative electrode portions, and a connecting member connecting the electrode portions of the power storage elements that are adjacent to each other. The terminal is connected to the connecting member.

(14) The power storage module may be preferably to be installed in a vehicle.

Detail of Embodiments According to the Present Disclosure

Embodiments according to the present disclosure will be described. The present disclosure is not limited to the embodiments. All modifications within and equivalent to the technical scope of claims may be included in the technical scope of claims.

Embodiment 1 will be described with reference to FIGS. 1 to 6. In Embodiment 1, the present disclosure is used in a power storage pack 2 to be installed in a vehicle 1. The power storage pack 2 is installed in the vehicle 1 such as an electric vehicle or a hybrid electric vehicle and used as a power source for the vehicle 1. In the following description, regarding components having the same configuration, some of the components may be indicated by reference signs and others may not be indicated by the reference signs.

[Whole Configuration]

As illustrated in FIG. 1, the power storage pack 2 is disposed in a middle section of the vehicle 1. A power control unit (PCU) 3 is disposed in a front section of the vehicle 1. The power storage pack 2 and the PCU 3 are connected to each other with a wire harness 4. The power storage pack 2 and the wire harness 4 are connected to each other with a connector, which is not illustrated. The power storage pack 2 includes a power storage module 10 including power storage elements 11.

(Power Storage Module 10)

Figure 2:
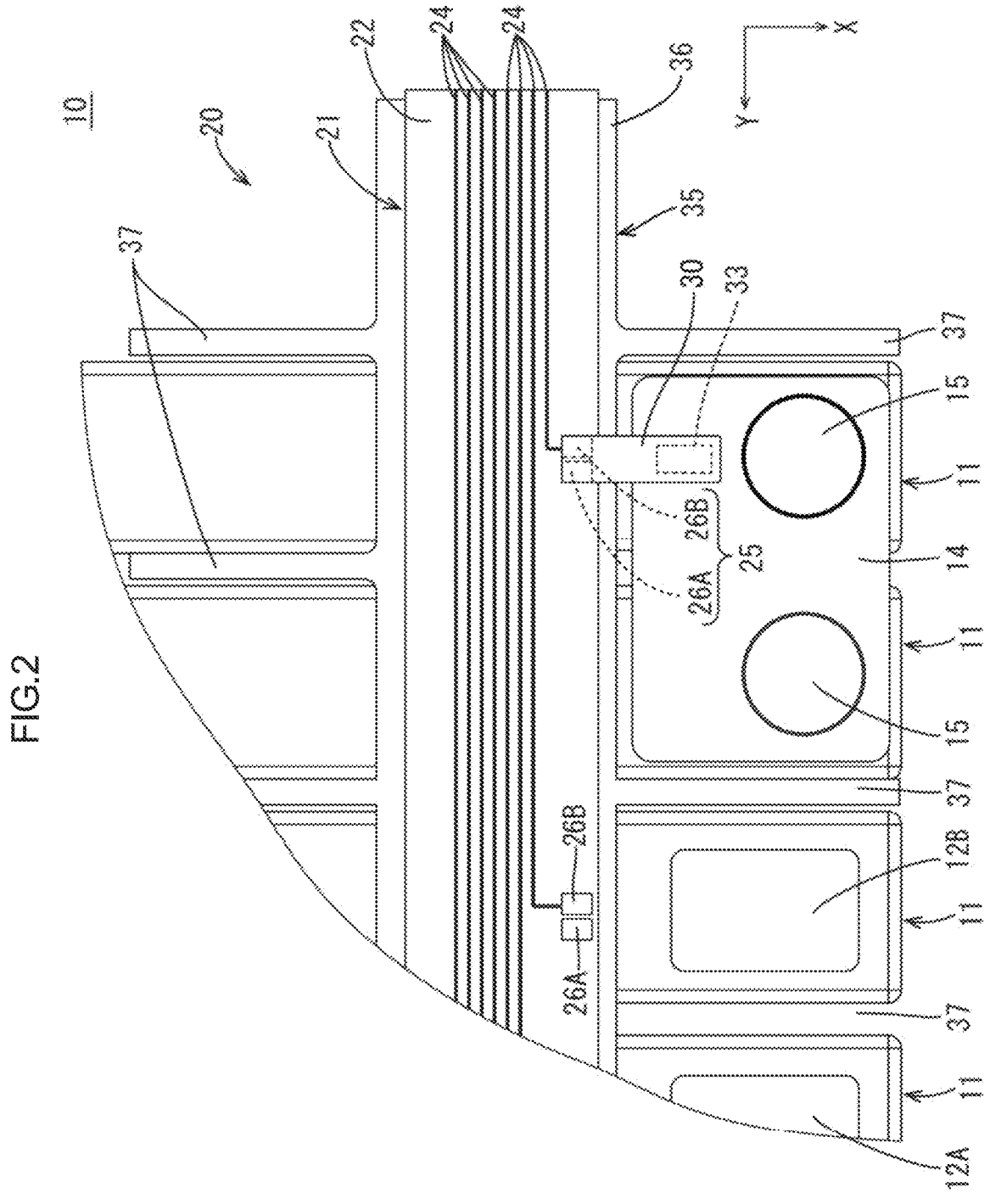
FIG. 2 is a plan view illustrating a portion of the power storage module according to a first embodiment.

As illustrated in FIG. 2 (FIG. 2 illustrates a portion of the power storage module 10 and other portion is not illustrated), the power storage module 10 includes multiple power storage elements 11, connecting members 14, and a wiring module 20. The power storage elements 11 are arranged in the right-left direction. The connecting member 14 connects electrode portions 12A and 12B of adjacent power storage elements 11. The wiring module 20 is attached to the power storage elements 11. In the following description, it is considered that an X direction, an Y direction, and a Z direction point the front side, the left side, and the upper side, respectively.

Each power storage element 11 has a rectangular flat box shape. The power storage elements 11 include electrode portions 12A, 12B (illustrated as positive electrode portions 12A, negative electrode portions 12B) that protrude from top surfaces. The power storage elements 11 may be secondary batteries such as lithium-ion secondary batteries or capacitors. Each of the electrode portions 12A, 12B has a top surface that is a flat rectangular shape and the connecting member 14 can be placed on the top surface. The adjacent power storage elements 11 are oriented such that polarities of the adjacent electrode portions 12A, 12B are opposite. The electrode 12A (12B) at an end of the series connection is connected to an external device such as an inverter via an electric line, which is not illustrated.

(Connecting Member 14)

Each connecting member 14 has a rectangular shape. The connecting member 14 is formed from a metal plate made of copper, copper alloy, aluminum, aluminum alloy, stainless steel (SUS), or other metal. The connecting member 14 has a sufficient size to cover two electrode portions 12A, 12B that are adjacent to each other. The connecting member 14 is fixed to the electrode portions 12A, 12B by laser-welding. Welding portions 15 are formed in the connecting member 14 after the laser-welding. Each welding portion 15 has a circular shape. In FIG. 2, one connecting member 14 is illustrated. With multiple connecting members 14, any number of the power storage elements 11 can be connected in series or in parallel.

(Wiring Module 20)

The wiring module 20 includes a flexible printed circuit board 21 (referred to as a FPC 21 in the following description), terminals 30, and an insulating protector 35 for holding the FPC 21. The FPC 21 and the connecting member 14 are electrically connected to each other via the terminal 30.

(FPC 21)

Figure 6:
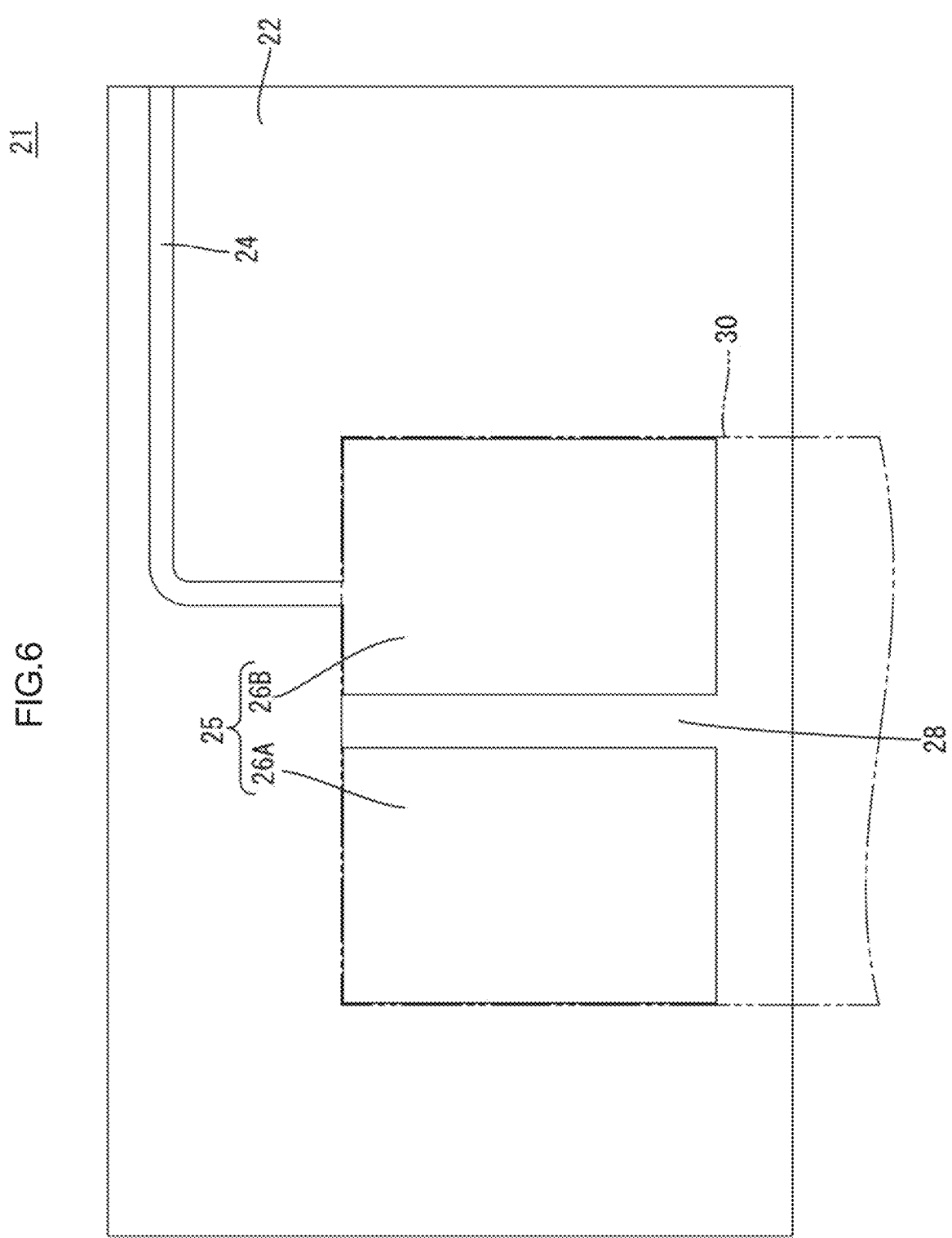
FIG. 6 is an enlarged plan view of the portion of the flexible printed circuit board.

The FPC 21 includes an insulating resin film 22 and electrically conductive lines 24. The electrically conductive lines 24 are made of metal such as a copper foil and are disposed on the insulating resin film 22. The insulating resin film 22 includes a base film and a cover film. The base film is made of synthetic resin having insulating properties such as polyimide having flexibility and insulating properties. The electrically conductive lines 24 are disposed on the base film. The cover film covers the electrically conductive lines 24 that are arranged on the base film. The electrically conductive lines 24 are arranged at intervals with respect to the front-rear direction and extend in the right-left direction to the positions corresponding to the connecting members 14, respectively. As illustrated in FIG. 6, a connecting member 14-side end of the electrically conductive line 24 is connected to a land 25 to which the terminal 30 can be soldered. The land 25 is exposed through an opening that is formed in the cover film by removing a section of the cover film. The lands 25 are made of metal such as copper foils and include soldering portions 26A, 26B (two soldering portions 26A, 26B in this embodiment) that are disposed on and fixed to the base film with adhesive.

The soldering portions 26A, 26B have a rectangular shape and are arranged in an extending direction in which the FPC 21 extends. At least one of the soldering portions 26A, 26B is connected to the electrically conductive line 24. In this embodiment, the soldering portion 26B on the right side is connected to the electrically conductive line 24; however, the soldering portion 26A on the left side may be connected to the electrically conductive line 24 or the soldering portion 26A and the soldering portion 26B on the right and left sides may be connected to the electrically conductive line 24.

A dividing section 28 is between the adjacent soldering portions 26A, 26B. The dividing section 28 is a non-metal surface and defines each of the soldering portions 26A, 26B. The dividing section 28 may be a portion of the cover film of the insulating resin film 22 that is between the soldering portions 26A, 26B. The dividing section 28 does not necessarily have the above configuration but may have a following configuration, for example. A rectangular copper foil (a metal foil) is attached to the base film to form a land (without including the dividing section) and a sheet (having a linear shape) made of insulating synthetic resin may be attached to the land as the dividing section. In such a configuration, a mask used in the printing process for soldering may be used for forming the dividing section, for example. A portion of the land (a copper foil of the solder portion) may be removed or insulating resin may be disposed on the land with coating for forming the dividing section.

An end of each electrically conductive line 24 on an opposite side from the land 25 is not illustrated; however, the end is electrically connected to an external electronic control unit. The electronic control unit includes a microcomputer and components. The electronic control unit has a known configuration to detect voltages, currents, and temperatures of the power storage elements 11 and to control charge and discharge of each power storage element 11.

(Terminal 30)

Figure 5:
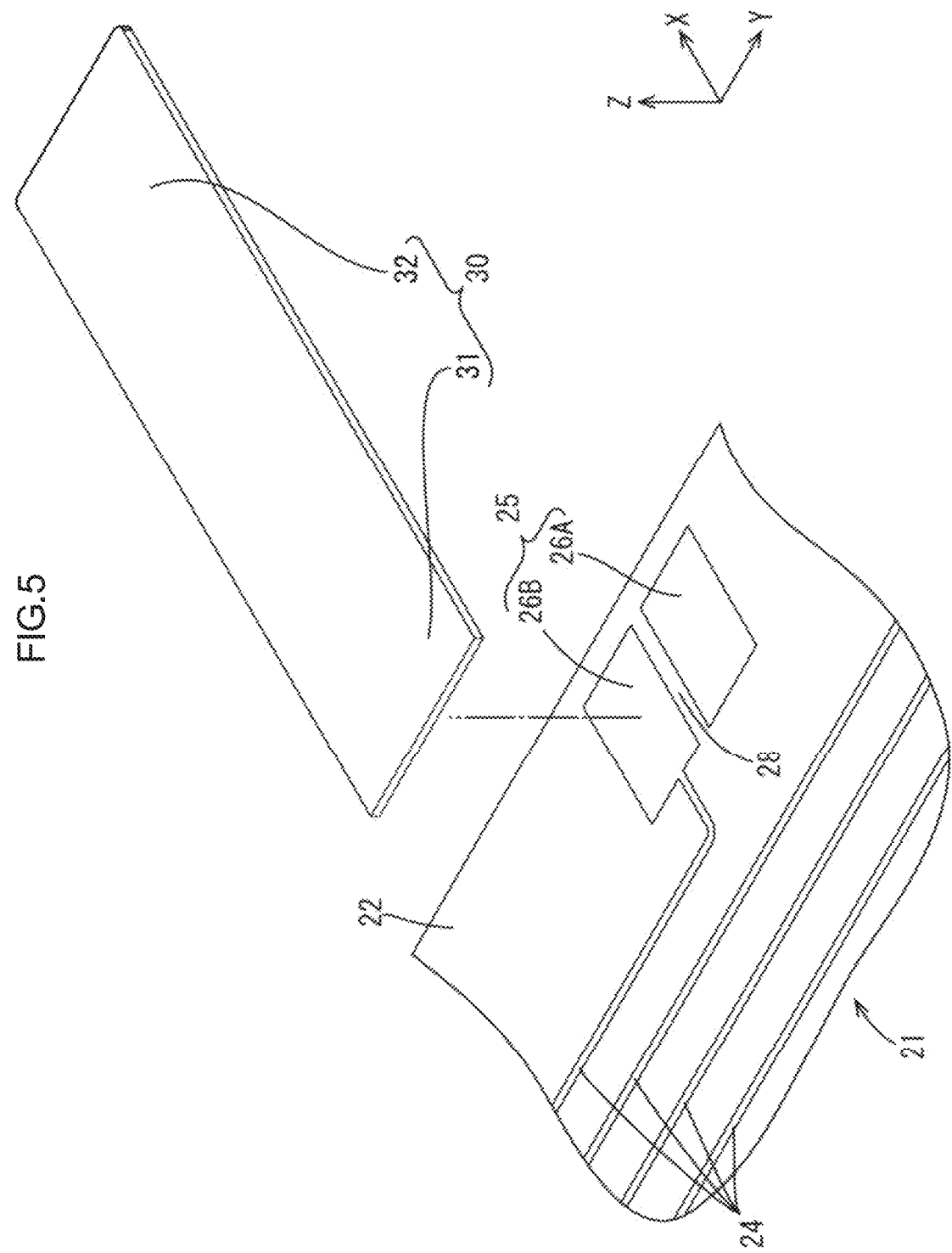
FIG. 5 is a perspective view illustrating the flexible printed circuit board and the terminal that is to be mounted on the flexible printed circuit board.

The terminals 30 are for detecting voltages of the connecting members 14 (and the electrode portions 12A, 12B). Each terminal 30 may be formed from a metal plate made of copper, copper alloy, aluminum, aluminum alloy, stainless steel (SUS), or other metal. The metal plate may be plated with nickel. As illustrated in FIG. 5, the terminal 30 has a long rectangular plate shape elongated in the front-rear direction. The terminal 30 includes an overlapping section 31 that overlaps the FPC 21 and a protruding section 32 that protrudes outward from the FPC 21 (outward from a side edge of the FPC 21 extending along the extending direction of the FPC 21). The protruding section 32 extends linearly in the front-rear direction and is welded to the connecting member 14.

Figure 3:
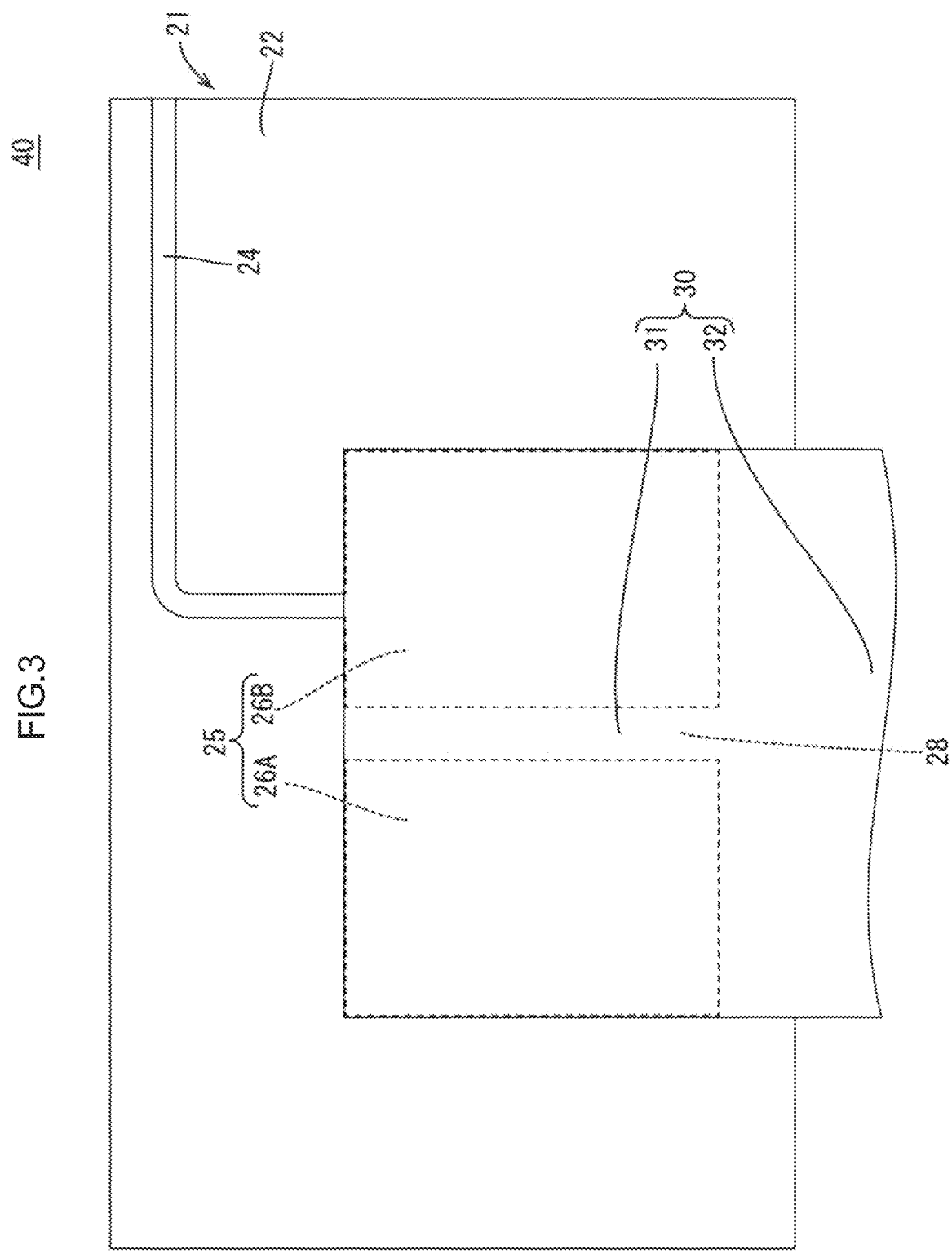
FIG. 3 is an enlarged plan view of a portion of a flexible printed circuit board including a terminal.
Figure 4:
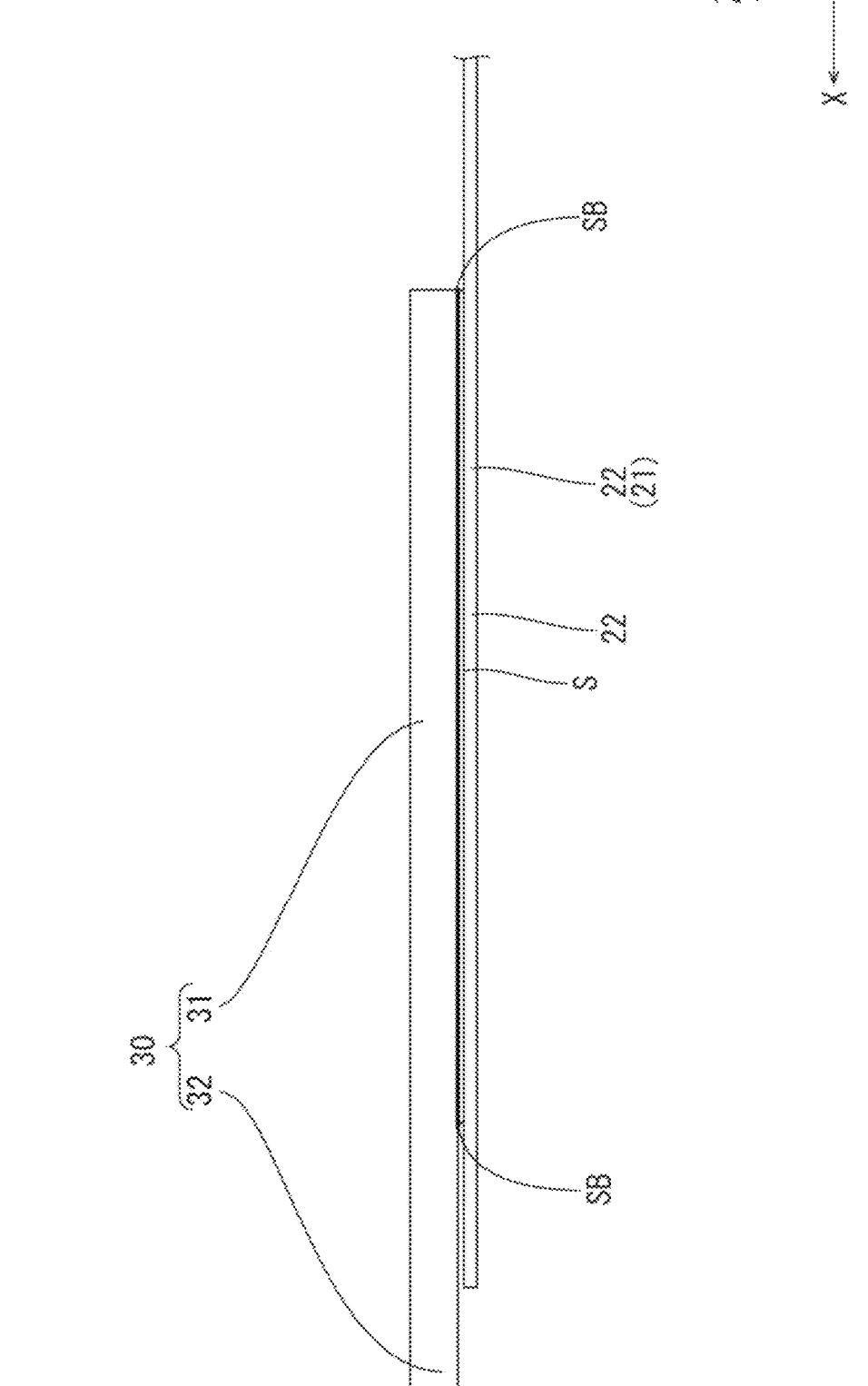
FIG. 4 is an enlarged side view of the portion of the flexible printed circuit board including a terminal.

As illustrated in FIG. 3, the overlapping section 31 is disposed in an area that covers a pair of soldering portions 26A, 26B entirely. As illustrated in FIG. 4, the overlapping section 31 is soldered to the soldering portions 26A, 26B with solder S. The solder S may be lead-free solder including tin, silver, copper. A solder fillet SB is formed at an outer peripheral edge of the solder S. The terminal 30 may be formed by punching a metal plate with a presser or cutting an outline of the plate with laser.

As illustrated in FIG. 2, the insulating protector 35 includes an arrangement portion 36 and walls 37. The FPC 21 is arranged on the arrangement portion 36. The walls 37 are plate members and insulate the adjacent power storage elements 11 from each other. The arrangement portion 36 is a flat plate member that extends in the right-left direction and the FPC 21 is fixed to a top surface of the arrangement portion 36 with adhesive.

Next, assembling of the power storage module 10 will be described.

As illustrated in FIG. 6, the soldering portions 26A, 26B of the lands 25 on the FPC 21 are coated with cream solder, for example, and the terminals 30 are disposed on the lands 25 (and the cream solder), respectively. Then, the FPC including the terminals 30 thereon is reflowed in a reflow furnace and the cream solder is heated and melted. With the solder S that is melted with reflow soldering being solidified, the terminals 30 are fixed to the FPC 21 with soldering. Thus, a flexible printed circuit board 40 including the terminal is obtained.

Next, a back surface of the FPC 21 is bonded and fixed to the top surface of the arrangement portion 36 of the insulating protector 35 with adhesive. Thus, the wiring module 20 is obtained. The connecting members 14 are disposed on the electrode portions 12A, 12B of the respective power storage elements 11 and the wiring module 20 is disposed on the power storage elements 11.

Next, the connecting members 14 are fixed to the electrode portions 12A, 12B with laser welding and the protruding sections 32 of the terminals 30 are fixed to the connecting members 14 with laser welding. Thus, as illustrated in FIG. 2, welding portions 15, 33 are formed on the connecting members 14 and the protruding sections 32, respectively, and the power storage module 10 is obtained.

According to this embodiment, following operations and advantageous effects are obtained.

The FPC 21 (the flexible printed circuit board) includes the electrically conductive lines 24 and the lands 25 that are connected to the electrically conductive lines 24. The terminals 30 can be fixed to the lands 25 of the FPC 21 with soldering. The land 25 includes the soldering portions 26A, 26B and the dividing section 28. The soldering portions 26A, 26B have metal surfaces and the terminal 30 is to be soldered to the soldering portions 26A, 26B. The dividing section 28 has a non-metal surface and is between the soldering portions 26A, 26B and defines each of soldering portions 26A, 26B.

According to this embodiment, even if the solder S on the soldering portions 26A, 26B is melted during the reflow soldering, the dividing section 28 having the non-metal surface that is between the adjacent soldering portions 26A, 26B suppresses the solder S from moving. Therefore, the terminal 30 is less likely to move from an original position when the solder S is melted. Therefore, problems are less likely to be caused by position displacement of the terminal 30.

The FPC 21 extends to have a belt shape and the soldering portions 26A, 26B are arranged in the extending direction in which the FPC 21 extends.

According to such a configuration, the position displacement of the terminal 30 with respect to the extending direction in which the FPC 21 extends is suppressed.

The land 25 is entirely disposed within the area that overlaps the terminal 30.

According to such a configuration, the area in which the solder S on the land 25 moves is smaller compared to a configuration in which a portion of the land 25 is outside the terminal 30. Therefore, position displacement of the terminal 30 is less likely to occur when the solder S is melted.

The FPC 21, the wiring module 20, the flexible printed circuit board 40 including a terminal, and the power storage module 10 are to be installed in the vehicle 1.

For example, in the process of reflow soldering, if the positions of the terminals and the FPC are displaced from each other, the solder that is solidified after being melted may include a portion having smaller strength than other portion. If vibration is applied from the vehicle to the portion having smaller strength, problems may be caused in the solder. In this embodiment, since the position displacement between the FPC 21 and the terminals 30 is less likely to be caused, the solder S that is solidified after being melted is less likely to include the portion having relatively small strength. Thus, this embodiment is particularly effective for the FPC 21, the wiring module 20, the flexible printed circuit board 40 including a terminal, and the power storage module 10 to be installed in the vehicle 1.

Embodiment 2

Figure 7:
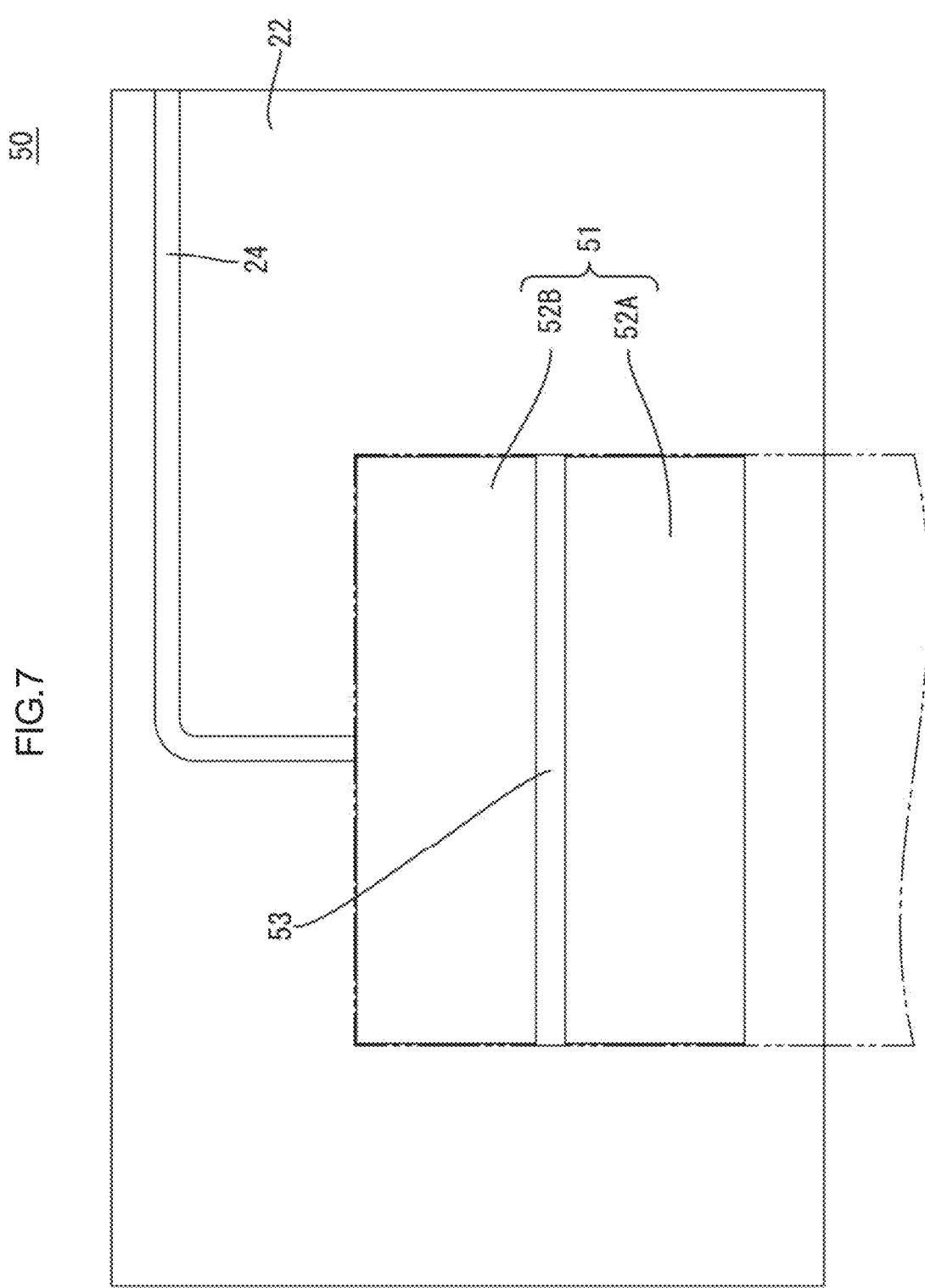
FIG. 7 is an enlarged plan view of a portion of a flexible printed circuit board according to a second embodiment.

Next, Embodiment 2 will be described with reference to FIG. 7. A land 51 on a FPC 50 of Embodiment 2 includes two soldering portions 52A, 52B that are arranged in a direction different from that of Embodiment 1. In the following description, components of this embodiment similar to those of Embodiment 1 will be indicated reference signs the same as the reference signs indicating the components in Embodiment 1 and will not be described.

Each of the two soldering portions 52A, 52B of the land 51 has a rectangular shape. The soldering portions 52A, 52B are arranged in the front-rear direction (a direction perpendicular to the extending direction in which the FPC 50 extends). A dividing section 53 is between the two soldering portions 52A, 52B.

According to Embodiment 2, the FPC 50 extends to have a belt shape and the soldering portions 52A, 52B are arranged in the direction crossing the extending direction in which the FPC 50 extends. With such a configuration, the position displacement of the terminal 30 with respect to the direction crossing the extending direction in which the FPC 50 extends is suppressed.

Embodiment 3

Figure 8:
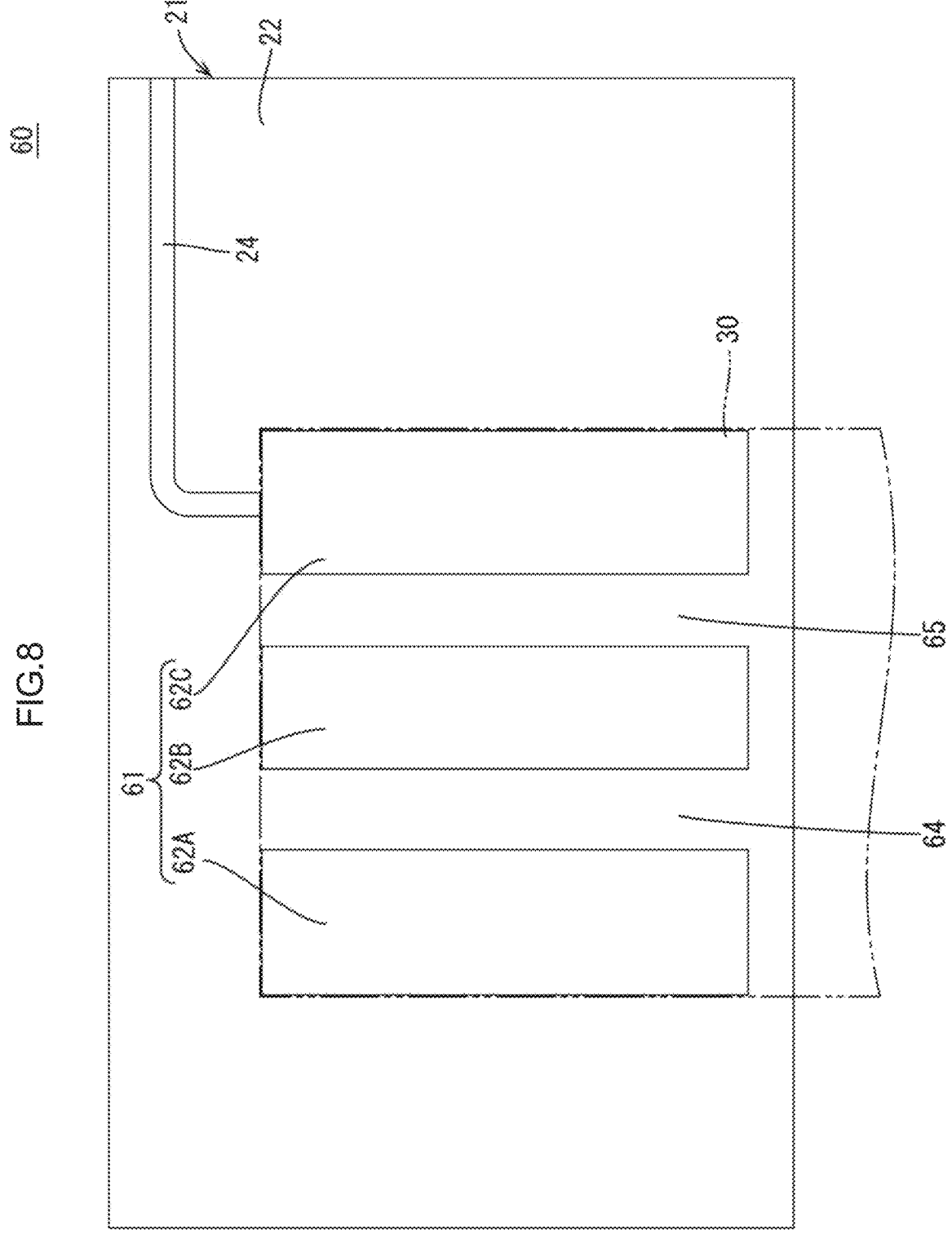
FIG. 8 is an enlarged plan view of a portion of a flexible printed circuit board according to a third embodiment.

Next, Embodiment 3 will be described with reference to FIG. 8. A land 61 on a FPC 60 of Embodiment 3 includes three soldering portions 62A to 62C. In the following description, components of this embodiment similar to those of the above embodiments will be indicated reference signs the same as the reference signs indicating the components in the above embodiments and will not be described.

Each of the three soldering portions 62A to 62C of the land 61 has a rectangular shape. The soldering portions 62A to 62C are arranged in the extending direction in which the FPC 60 extends. The soldering portions 62A, 62C that are disposed at two ends with respect to an arrangement direction have a dimension measured in the arrangement direction greater than that of the soldering portion 62B that is disposed at a middle with respect to the arrangement direction. Dividing sections 64, 65 are provided between the three soldering portions 62A to 62C.

According to this embodiment, three (or more than three) soldering portions 62A to 62C are arranged and the soldering portions 62A, 62C that are disposed at two ends with respect to the arrangement direction have the dimension measured in the arrangement direction greater than that of the soldering portion 62B that is disposed on an inner side with respect to the two ends.

According to such a configuration, the position displacement of the terminal 30 with respect to the arrangement direction in which the three soldering portions 62A to 62C are arranged is suppressed.

Embodiment 4

Figure 9:
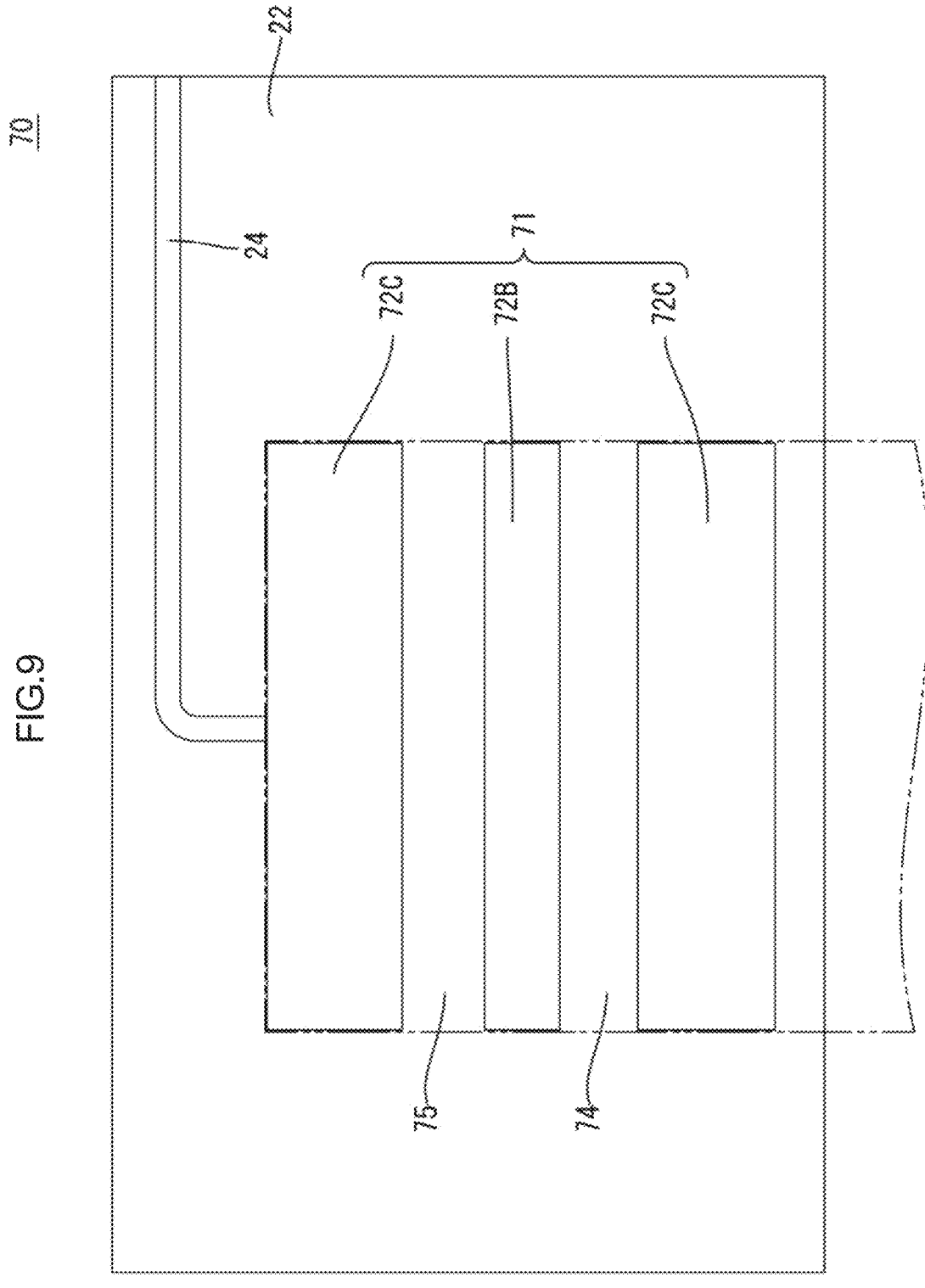
FIG. 9 is an enlarged plan view of a portion of a flexible printed circuit board according to a fourth embodiment.

Next, Embodiment 4 will be described with reference to FIG. 9. A land 71 on a FPC 70 of Embodiment 4 includes three soldering portions 72A to 72C that are arranged in a direction different from that of Embodiment 3. In the following description, components of this embodiment similar to those of Embodiment 3 will be indicated reference signs the same as the reference signs indicating the components in Embodiment 3 and will not be described.

Each of the three soldering portions 72A to 72C of the land 71 has a rectangular shape. The soldering portions 72A to 72C are arranged in a direction perpendicular to the extending direction in which the FPC 70 extends. The soldering portions 72A, 72C that are disposed at two ends with respect to the arrangement direction have a dimension measured in the arrangement direction greater than that of the soldering portion 72B that is disposed at a middle with respect to the arrangement direction. Dividing sections 74, 75 are provided between the three soldering portions 72A to 72C.

According to this embodiment, three (or more than three) soldering portions 72A to 72C are arranged and the soldering portions 72A, 72C that are disposed at two ends with respect to the arrangement direction have the dimension measured in the arrangement direction greater than that of the soldering portion 72B that is disposed on an inner side with respect to the two ends.

According to such a configuration, the position displacement of the terminal 30 with respect to the arrangement direction in which the three soldering portions 72A to 72C are arranged is suppressed.

Embodiment 5

Figure 10:
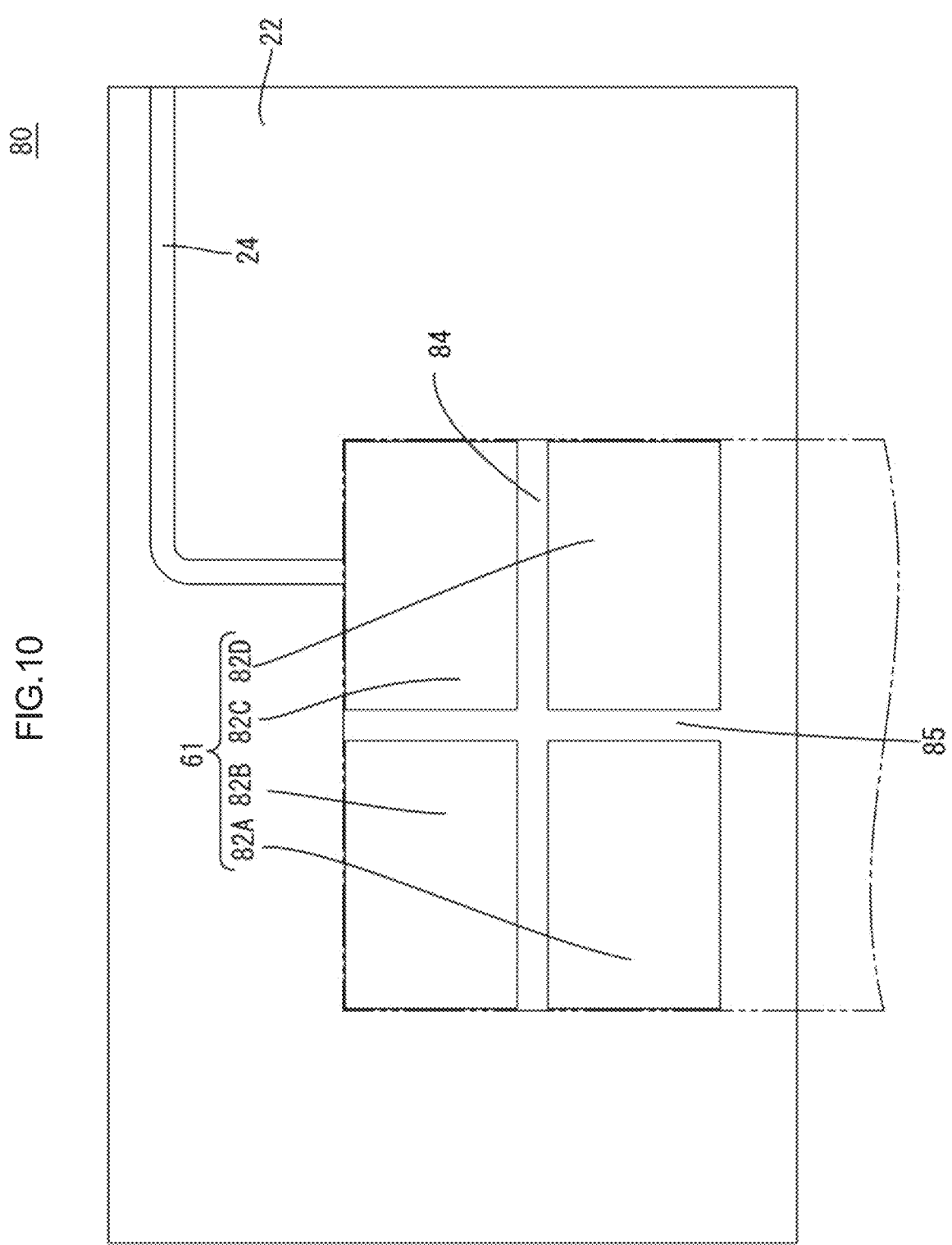
FIG. 10 is an enlarged plan view of a portion of a flexible printed circuit board according to a fifth embodiment.

Next, Embodiment 5 will be described with reference to FIG. 10. A land 81 on a FPC 80 of Embodiment 5 includes four soldering portions 82A to 82D. In the following description, components of this embodiment similar to those of the above embodiments will be indicated reference signs the same as the reference signs indicating the components in the above embodiments and will not be described.

Each of the four soldering portions 82A to 82D of the land 81 has a rectangular shape elongated in an extending direction in which the FPC 80 extends. Two soldering portions are arranged in the front-rear direction and two soldering portions are arranged in the right-left direction. A dividing section 84 (a first dividing section) and a dividing section 85 (a second dividing section) that cross each other and form a cross shape are provided between the four soldering portions 82A to 82D. The dividing section 84 and the dividing section 85 extend in directions that cross each other (different directions). The dividing section 84 defines each of the soldering portions 82A, 82B (82C, 82D) that are disposed on a front side and a rear side. The dividing section 85 defines each of the soldering portions 82A, 82D (82B, 82C) that are disposed on a left side and a right side.

Embodiment 6

Figure 11:
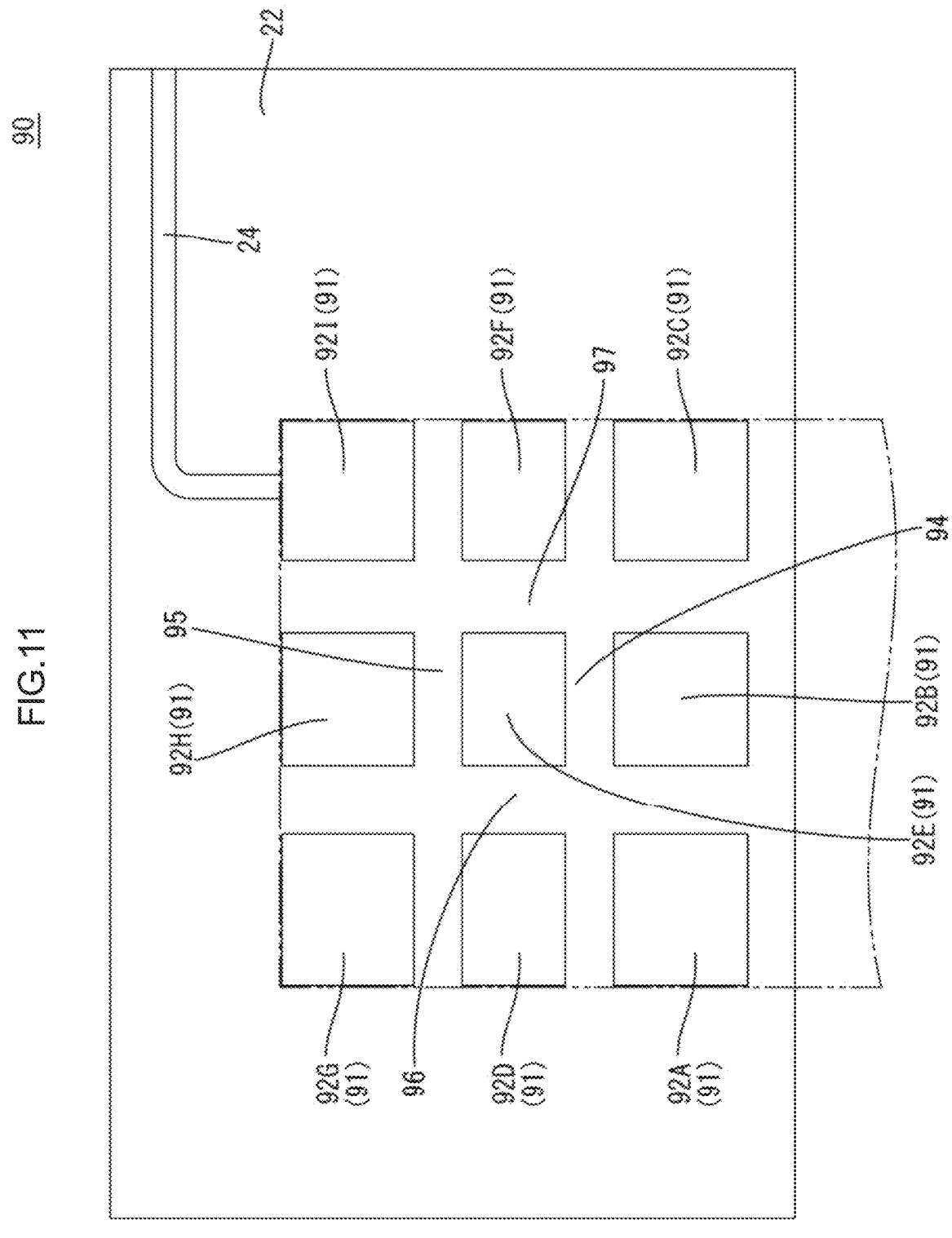
FIG. 11 is an enlarged plan view of a portion of a flexible printed circuit board according to a sixth embodiment.

Next, Embodiment 6 will be described with reference to FIG. 11. A land 91 on a FPC 90 of Embodiment 6 includes nine soldering portions 92A to 92I. In the following description, components of this embodiment similar to those of the above embodiment swill be indicated reference signs the same as the reference signs indicating the components in the above embodiments and will not be described.

Each of the nine soldering portions 92A to 92I of the land 91 has a rectangular shape. Three soldering portions are arranged in the extending direction in which the FPC 90 extends and three soldering portions are arranged in the direction perpendicular to the extending direction in which the FPC 90 extends. The soldering portions 92A to 92C, 92G to 92I that are disposed at two ends with respect to a direction perpendicular to the extending direction in which the FPC 90 extends have a dimension measured in the front-rear direction greater than that of the soldering portions 92D to 92F that are disposed at a middle. Each of the nine soldering portions 92A to 92I is defined by dividing sections 94, 95 with respect to the front-rear direction and defined by dividing sections 96, 97 with respect to the right-left direction. The dividing sections 94, 95 extend in the right-left direction and the dividing sections 96, 97 extend in the front-rear direction.

Other Embodiments

Figure 12:
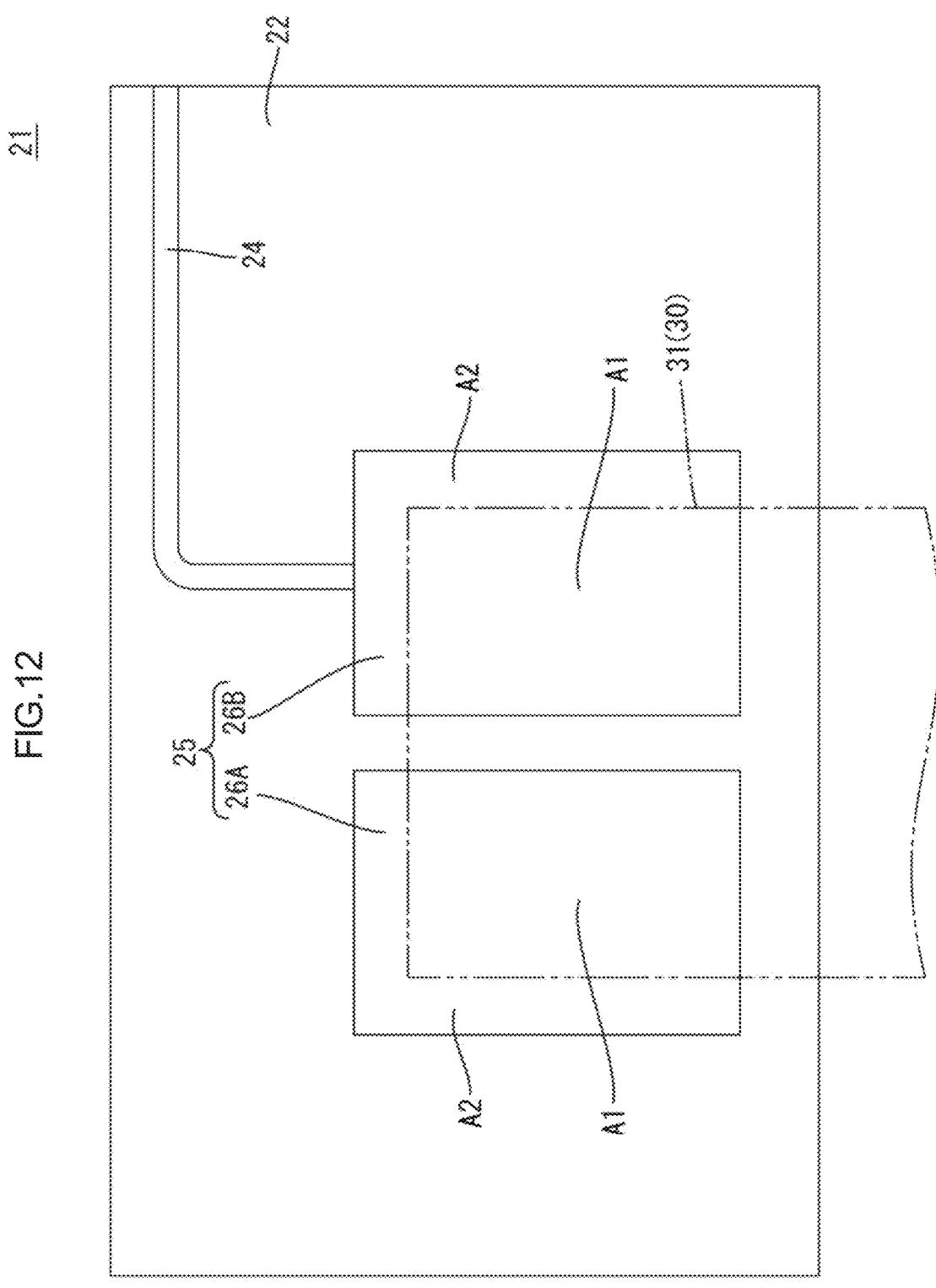
FIG. 12 is an enlarged plan view of a portion of a flexible printed circuit board according to another embodiment.
Figure 13:
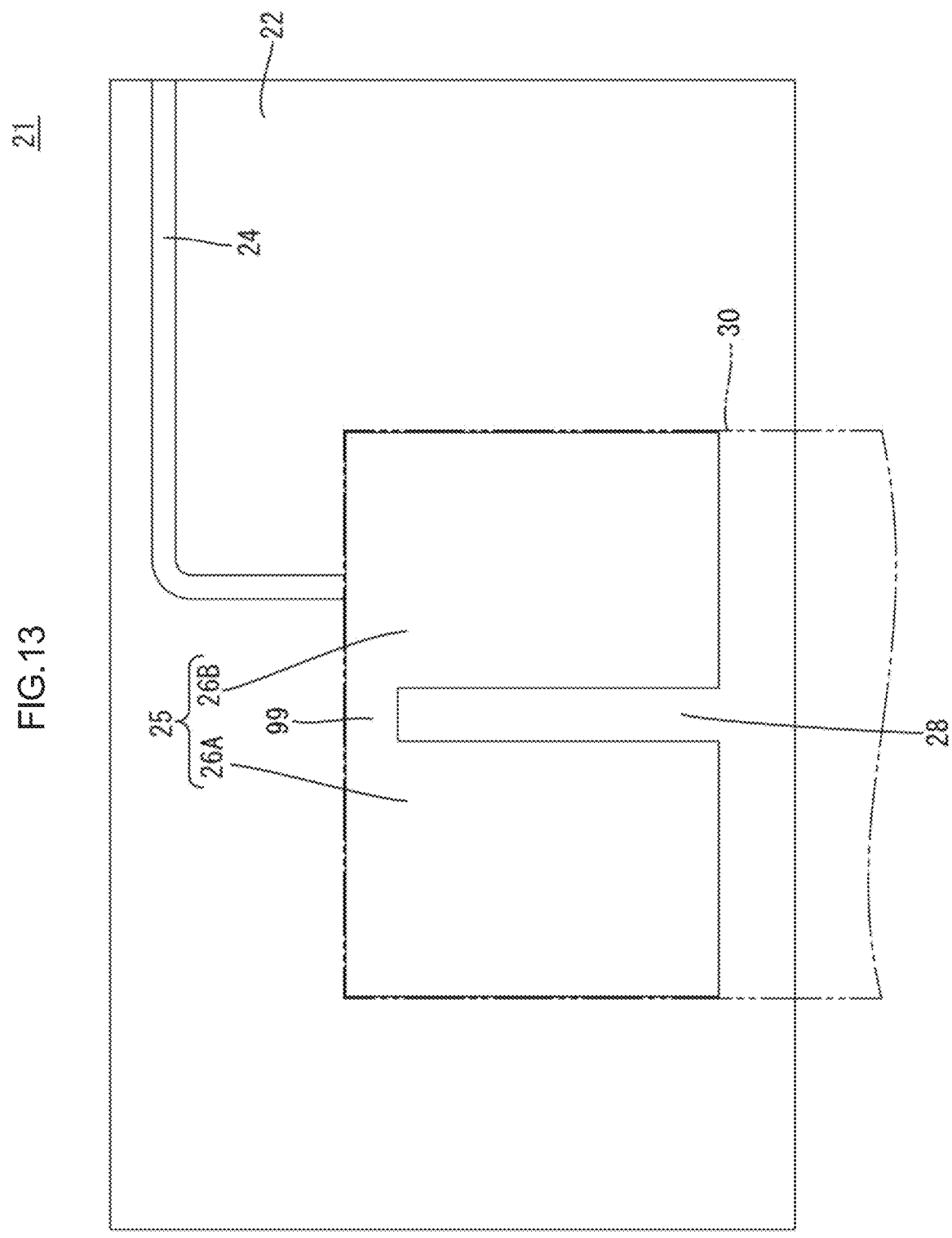
FIG. 13 is an enlarged plan view of a portion of a flexible printed circuit board according to other embodiment.

The technology disclosed herein is not limited to the embodiments described above and illustrated in the drawings. For example, the following embodiments will be included in the technical scope of the technology described in the present disclosure.
(1) The number of soldering portions of the land is not limited to the number in the above embodiments but may be a different number. In a configuration of the FPC 21 including multiple lands, one land or multiple lands may include the soldering portions 26A, 26B.
(2) The protruding sections 32 of the terminals 30 extend in a form of flat plate but may have different shapes. For example, the protruding sections 32 may have a bar shape. The protruding sections 32 are fixed to the connecting members 14 with laser welding but may be fixed to the connecting members 14 with welding other than laser welding, soldering, crimping, or pressing.
(3) In the first embodiment and other embodiments, the soldering portions are entirely covered with the terminal 30. For example, as illustrated in FIG. 12, the soldering portions 26A, 26B may include sections A1 that overlap the terminal 30 and sections A2 that do not overlap the terminal 30. Portions of the soldering portions 26A, 26B may not be covered with the overlapping section 31 of the terminal 30 and may be exposed. With such a configuration, because the solder fillet SB of the solder S at an edge surface (a side surface) of the overlapping section 31 of the terminal 30 is exposed, (an X-ray test is not required and) an appearance test of the solder fillet SB of the solder S can be performed easily. With the solder fillet SB of the solder S provided at the edge surface (the side surface) of the terminal 30, bonding strength between the soldering portions 26A, 26B and the terminal 30 can be increased.
(4) The dividing section may not be a film or a sheet but may be various kinds of members having non-metal surfaces. For example, the dividing section may be formed by solidifying an adhesive.
(5) As illustrated in FIG. 13, a bridge section 99 that is made of metal such as a copper foil may be provided between the soldering portions 26A, 26B (52A, 52B, 62A to 62C, 72A to 72C, 82A to 82D, 92A to 92I) to electrically connect the soldering portions.

EXPLANATION OF SYMBOLS

1: Vehicle
2: Power storage pack
3: PCU
4: Wire harness
10: Power storage module
11: Power storage element
12A, 12B: Electrode portion
14: Connecting member
15: Welding portion
20: Wiring module
21, 50, 60, 70, 80, 90: FPC (Flexible printed circuit board)
22: Insulation resin film
24: Electrically conductive line
25, 51, 61, 71, 81, 91: Land
26A, 26B, 52A, 52B, 62A to 62C, 72A to 72C, 82A to 82D, 92A to 92I: Soldering portion
28, 53, 64, 65, 74, 75, 84, 85, 94 to 97: Dividing section
30: Terminal
31: Overlapping section
32: Protruding section
33: Welding portion
35: Insulating protector
36: Arrangement portion
37: Wall
40: Flexible printed circuit board including a terminal
99: Bridge section
S: Solder
SB: Solder fillet

The invention claimed is:

1. A flexible printed circuit board comprising:

an electrically conductive line; and a land connected to the electrically conductive line and to be connected to a terminal, the land including soldering portions that have metal surfaces and to which the terminal is to be soldered, wherein the terminal includes an overlapping section that overlaps the flexible printed circuit board and a protruding section that protrudes outward from the flexible printed circuit board and is soldered to a connecting member that connects electrode portions of power storage elements.

2. The flexible printed circuit board according to claim 1, further comprising a dividing section that is between the soldering portions, the dividing section having a non-metal surface and defining each of the soldering portions that are adjacent to each other.

3. The flexible printed circuit board according to claim 1, wherein the flexible printed circuit board extends to have a belt shape, and the soldering portions are arranged in an extending direction in which the flexible printed circuit board extends.

4. The flexible printed circuit board according to claim 1, wherein the flexible printed circuit board extends to have a belt shape, and the soldering portions are arranged in a direction crossing an extending direction in which the flexible printed circuit board extends.

5. A wiring module comprising:

a flexible printed circuit board including an electrically conductive line, and a land connected to the electrically conductive line and including soldering portions that have metal surfaces; and a terminal including an overlapping section that overlaps the flexible printed circuit board and is connected to the land, and a protruding section that protrudes outward from the flexible printed circuit board and is connected to a connecting member that connects electrode portions of power storage elements.

* * * * *